(12) United States Patent
Isenberger et al.

(10) Patent No.: US 7,164,166 B2
(45) Date of Patent: Jan. 16, 2007

(54) MEMORY CIRCUIT WITH SPACERS BETWEEN FERROELECTRIC LAYER AND ELECTRODES

(75) Inventors: Mark S. Isenberger, Corrales, NM (US); Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/804,795

(22) Filed: Mar. 19, 2004

(65) Prior Publication Data

US 2005/0205907 A1    Sep. 22, 2005

(51) Int. Cl.
*H01L 29/76* (2006.01)

(52) U.S. Cl. .................. 257/295; 257/306; 257/309; 257/310

(58) Field of Classification Search ............... 257/295, 257/306, 309, 310; 438/3
See application file for complete search history.

(56) References Cited

U.S. PATENT DOCUMENTS

| | | | | |
|---|---|---|---|---|
| 5,796,133 A | * | 8/1998 | Kwon et al. ............... 257/295 |
| 6,150,183 A | * | 11/2000 | Fukuda et al. ............... 438/3 |
| 2002/0196653 A1 | * | 12/2002 | Kim et al. ................. 365/100 |

* cited by examiner

*Primary Examiner*—Hung Vu
(74) *Attorney, Agent, or Firm*—Schwabe, Williamson & Wyatt, P.C.

(57) ABSTRACT

A memory circuit is provided with a spacer formed on a support surface and positioned adjacent to a first electrode surface of a first electrode. The memory circuit further includes a ferroelectric layer formed on the first electrode and the spacer.

11 Claims, 9 Drawing Sheets

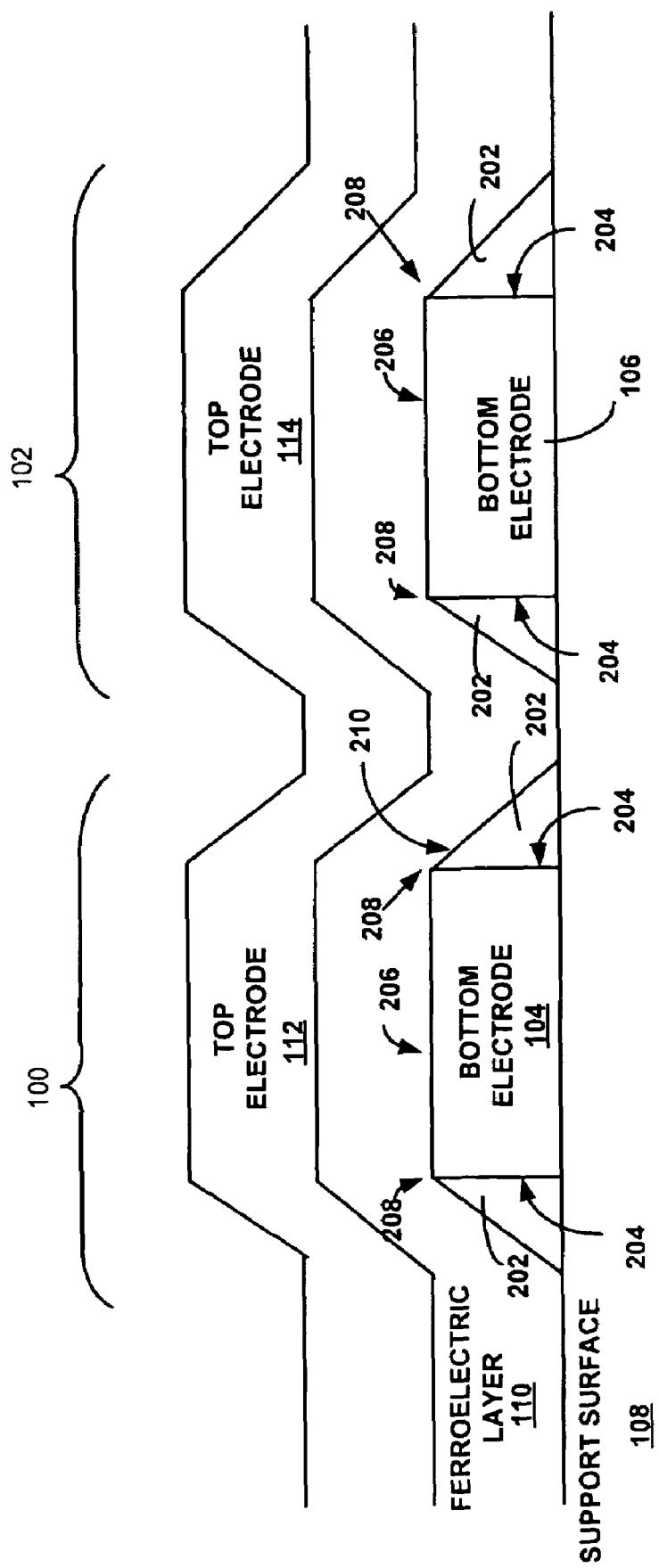

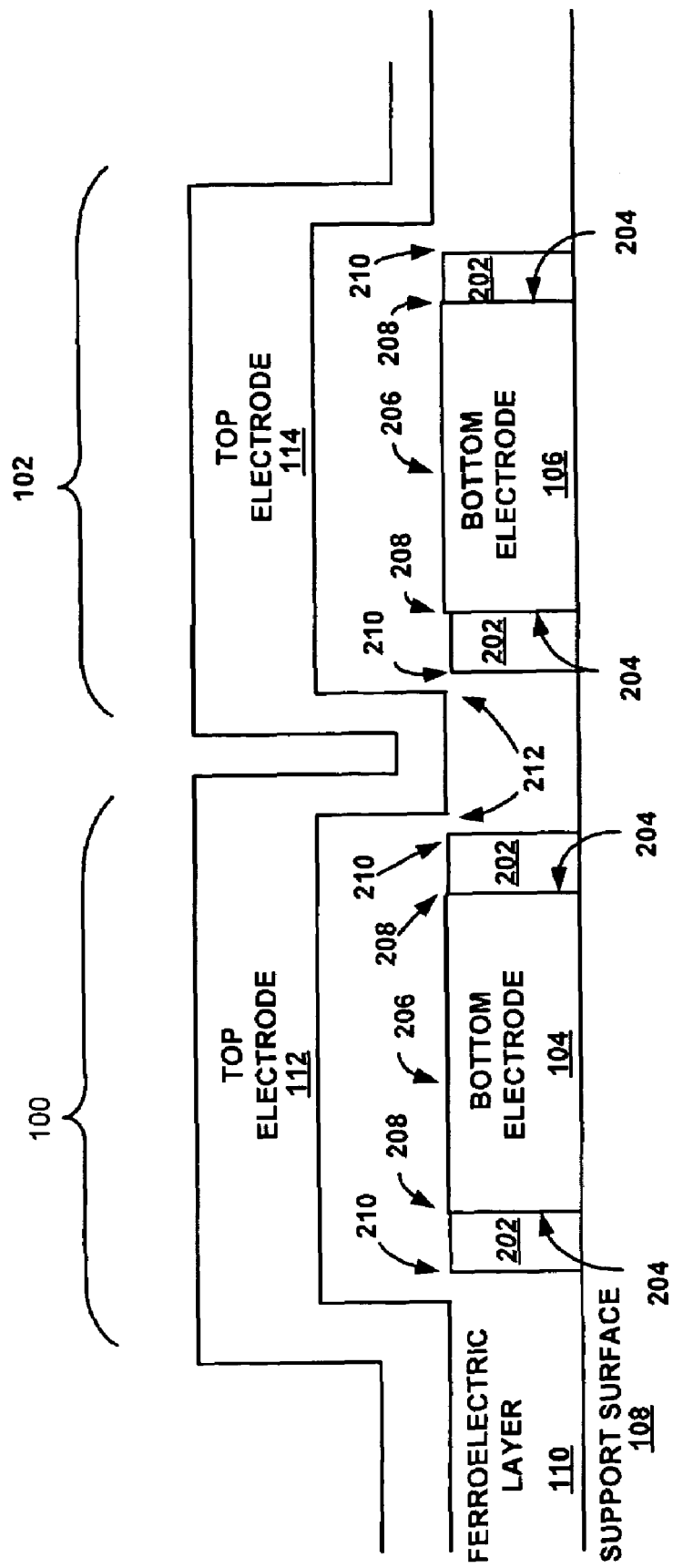

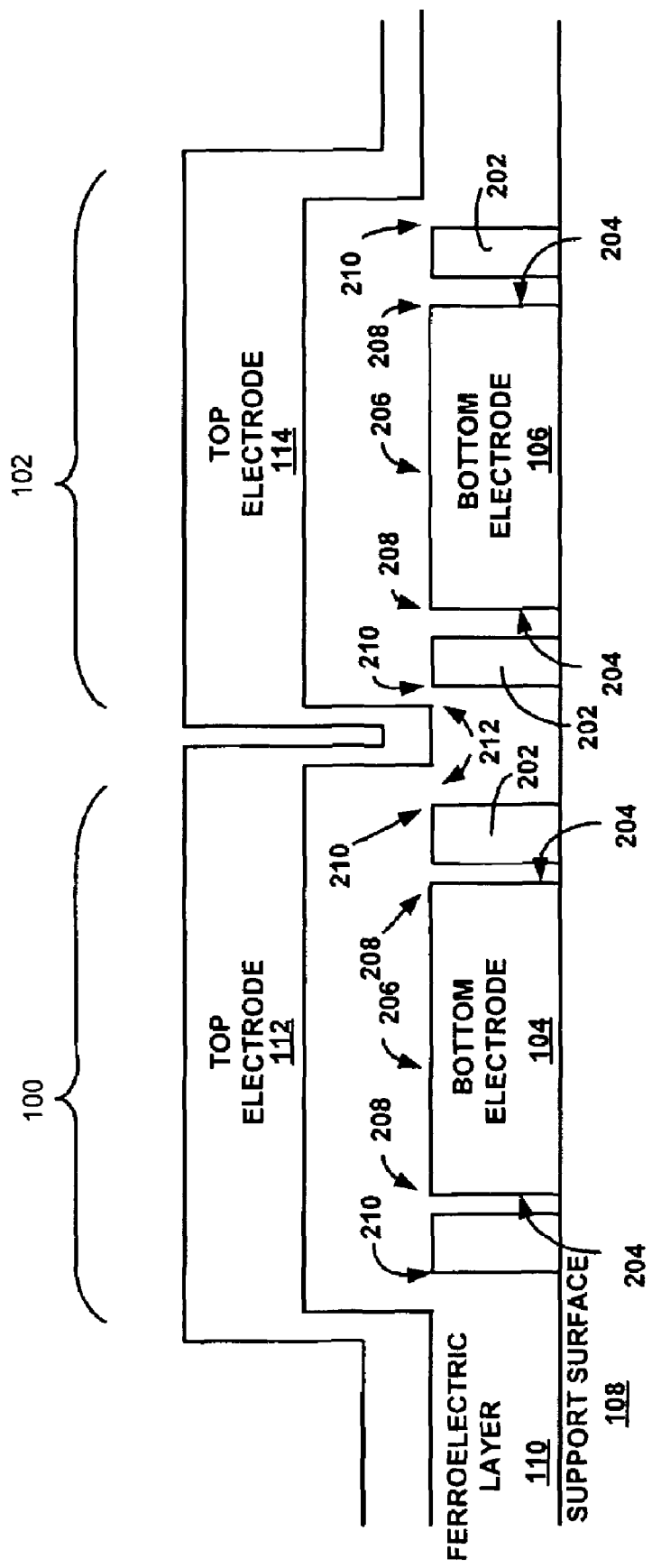

600

MEMORY CIRCUIT WITH SPACERS BETWEEN FERROELECTRIC LAYER AND ELECTRODES

BACKGROUND OF THE INVENTION

1. Field of the Invention

The present invention relates to, but is not limited to, electronic devices, and in particular, to the field of electrodes.

2. Description of Related Art

In the current state of integrated circuit technology, one approach to memory design is the use of ferroelectric materials sandwiched between pairs of electrodes to form non-volatile memory cells. A ferroelectric material may be a polymer containing electric dipoles that may uniformly align under certain conditions such as under the influence of electric fields.

By forming a plethora of these memory cells, memory circuits may be formed. These circuits may comprise of multiple bottom electrodes laid parallel to each other in one direction and a second set of top electrodes laid over the first set of bottom electrodes and perpendicular to the first set of bottom electrodes. A ferroelectric layer is sandwiched between the bottom set of electrodes and the top set of electrodes. Memory cells are formed at each point where a top electrode crosses over a bottom electrode. This configuration results in a grid pattern of individual memory cells. The electric dipoles contained in the ferroelectric layer may uniformly align towards a single direction under the influence of an electric field, such as a field produced by intersecting electrodes that have been energized. The electric dipoles may maintain their orientations even after the electric field has been removed, thus making the memory cells nonvolatile.

When a memory circuit is formed in such a manner, they form a grid of memory cells. Multiple grids may be stacked one on top of the other to form a passive array of non-volatile memory cells.

BRIEF DESCRIPTION OF THE DRAWINGS

Embodiments of the present invention will be described referencing the accompanying drawings in which like references denote similar elements, and in which:

FIG. 2B illustrates two adjacent ferroelectric memory cells with sloping spacers in accordance with another embodiment.

FIG. 2C illustrates two adjacent ferroelectric memory cells with rectangularly shaped spacers in accordance with another embodiment.

FIG. 2D illustrates two adjacent ferroelectric memory cells with rectangularly shaped spacers separated from bottom electrodes in accordance with another embodiment.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

The term chip, integrated circuit, semiconductor device and microelectronic device are sometimes used interchangeably in this field. The present invention relates to the manufacture of chips, integrated circuits, semiconductor devices and microelectronic devices as these terms are commonly understood in the art.

The following description includes terms such as top, bottom, lower, upper, elevation, and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

Figure 1:
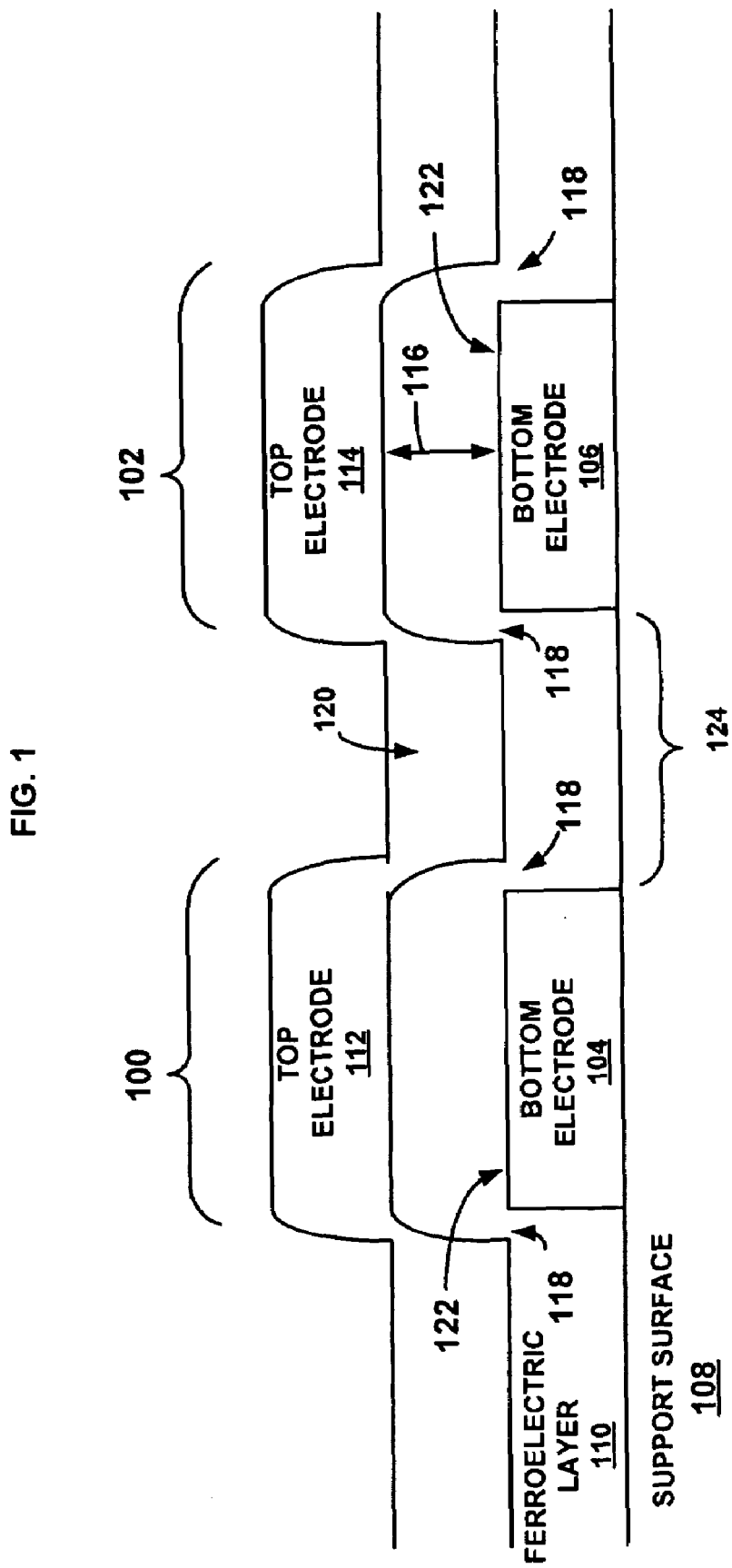
FIG. 1 illustrates two adjacent ferroelectric memory cells.

FIG. 1 is a cross-sectional view of a pair of adjacent ferroelectric memory cells 100 and 102. These memory cells 100 and 102 may be part of a passive array of memory cells for non-volatile memory. Each memory cell 100 and 102 includes first electrodes ("bottom electrodes") 104 and 106 that may be disposed on a support surface 108. The support surface 108 may be, for example, a dielectric or insulation material (herein "insulation material"). The support surface 108 itself may be on a substrate of a die or a chip. A ferroelectric layer 110 lies on top of the bottom electrodes 104 and 106. The ferroelectric layer 110 is made of a material containing electric dipoles that may be oriented in a particular direction under the influence of an electric field. On top of the ferroelectric layer 110 and directly over the bottom electrodes 104 and 106 are second electrodes ("top electrodes") 112 and 114. In this example, the two top electrodes 112 and 114 are electrically coupled to each other as indicated by 120. Further, the top electrode 112 on the left may be coupled to another top electrode (not shown) located to the left while the top electrode 114 on the right may be coupled to another top electrode (not shown) located to the right. Correspondingly, each of the bottom electrodes 104 and 106, may be electrically coupled to two other bottom electrodes, one located behind the plane of the figure (FIG. 1) and the other located in front of the plane of the figure.

When forming the memory cells 100 and 102, the bottom electrodes 104 and 106 are typically first formed and patterned using, for example, lithography and etch processes. The ferroelectric layer 110 may be formed on top of the bottom electrodes 104 and 106 using, for example, spin-coating and annealing techniques. After the ferroelectric layer 110 is deposited and annealed, the top electrodes 112 and 114 may be deposited and patterned using, for example, conventional metal deposition techniques.

In forming the memory cells 100 and 102, it may be preferable to at least maintain a minimum and/or a consistent thickness of ferroelectric layer 110 (the thickness 116 being the separation distance created by the ferroelectric layer 110 between a top electrode 112 and 114 and a bottom electrode 104 and 106). This is because if the ferroelectric layer 110 is too thin between the top and bottom electrodes, pin holes and electrical shorts may form between the top electrode 112 and 114 and the bottom electrode 104 and 106. Such problems may preclude the memory cells 100 and 102 from functioning properly.

Unfortunately, controlling the thickness 116 of the ferroelectric layer 110 may be difficult using conventional techniques. That is, it may be particularly difficult to control the thickness of the ferroelectric layer 110 around the corner regions 118 of the bottom electrodes 104 and 106. This may be due to at least in part to the particular properties of the material used (e.g., the viscosity of the material) to form the ferroelectric layer and the technique used (e.g., spincoating) to deposit the material onto the bottom electrodes 104 and 106. For example, the material used to form the ferroelectric layer 110 may be a soluble polymer having properties, such as viscosity values, that tend to result in the thinning of layers in the area around a transition point. The transition point is the point where the "elevation" of the underlying surface changes (e.g., in FIG. 1, the underlying surface is the top surface 122 of the bottom electrode 104 and 106 and the support surface 108). The "sharper" the transition (i.e., steeper drop in elevation), the more likely and/or greater the thinning of the overlaying ferroelectric layer 110 in the area around the transition point. Thus, maximum thinning may occur in areas around transition points that have a 90-degree or greater vertical drop in elevation. As a result, when the ferroelectric layer 110 is being formed on top of and around the bottom electrodes 104 and 106, the dramatic drop-off at the corners of the bottom electrodes 104 and 106 may cause the ferroelectric layer being formed around the corner regions 118 to be thinned, which may cause pin holes and/or electrical shorts to form.

Another problem that may develop during the formation of these memory cells 100 and 102 is the formation of parasitic cells that may form in the gap region 124 between adjacent bottom electrodes 104 and 106. Such cells may cause undesired leakage currents and electric fields. These cells may form because only the ferroelectric layer 110 occupies the gap region 124 that separates the adjacent bottom electrodes 104 and 106. Therefore, the ferroelectric layer 110 that is in the gap region 124 may be induced (e.g., polarized) by the electric fields generated by the adjacent electrodes 104 and 106.

In order to resolve these issues, certain techniques have been proposed. One approach is to minimize the thickness (i.e., height from the support surface) of the bottom electrode 104 and 106 and place very tight control limits on the metal deposition thickness and metal etch rate. By reducing the height of the bottom electrode 104 and 106, better control of the thickness of the ferroelectric layer 110 may be achieved.

Unfortunately this approach may not result in an optimal memory cell design since it may be preferable to increase the thickness of the electrode while reducing the thickness of the ferroelectric layer. That is, by increasing the size of the bottom electrode, resistivity of the electrode may be attenuated. Further, by reducing the size of the ferroelectric layer, lower voltage may be used in order to operate the memory cells 100 and 102 (the voltage needed to align the dipoles within the ferroelectric layer).

Figure 2A:
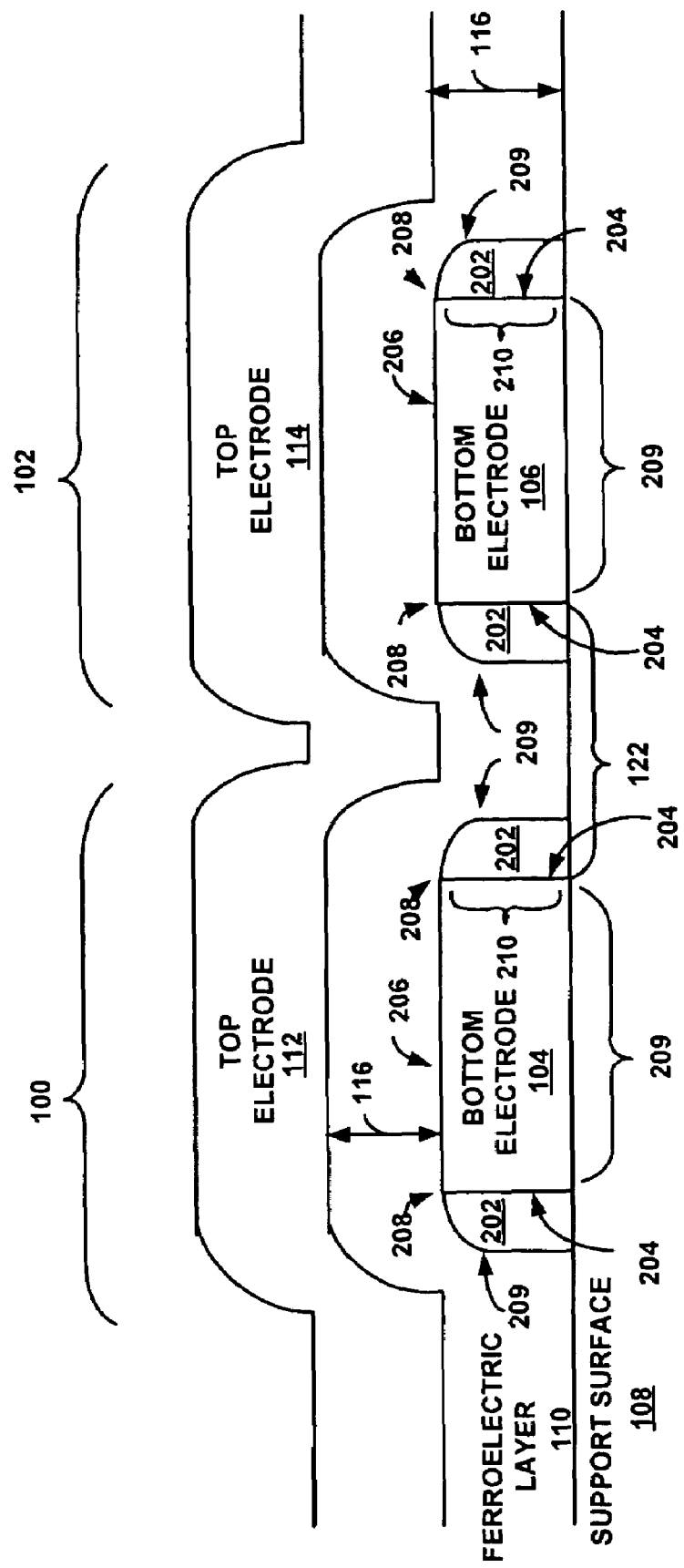
FIG. 2A illustrates two adjacent ferroelectric memory cells with rounded top spacers in accordance with an embodiment of the invention.

According to some embodiments of the invention, a spacer may be formed and positioned on the support surface adjacent to the side electrode surface of a bottom electrode in order to move the transition points away from the bottom electrode and/or to reduce the sharpness of the transitions. FIG. 2A depicts two memory cells 100 and 102 with spacers 202 located adjacent to first electrodes ("bottom electrodes") 104 and 106 according to one embodiment. The bottom electrodes having a first electrode surface ("side surface') 204 that intersects the support surface 108, a second electrode surface ("top surface') 206 and electrode corners 208. Although the top surface 206 is depicted here as being parallel to the support surface 108, it may be angularly disposed relative to the support surface 108. Similarly, although the side surface 204 is depicted here as being perpendicular to the support surface 108, it may be oriented at a greater or less than the 90 degree (with respect to the support surface 108) orientation depicted here. The side surface 204 may also be considered the "electrode transition surface" because it is the surface that is the bridge between the elevated top surface 206 and the lower support surface 108. The spacers 202 are located on the portions of the support surface 108 adjacent to the side surface 204. The spacers 202 may comprise of a dielectric or insulation material.

In one embodiment, the thickness 116 of the ferroelectric layer 110 may remain constant regardless of whether the layer is over an electrode, a spacer or the support surface, e.g. about 60 nm, and the width 209 of the bottom electrodes 104 and 106 may be about 250 nm, and the width of the gaps 122 between the bottom electrodes may be about 250 nm. Note however, that the specific dimensions of various components may vary depending upon the specific design criteria.

Still referring to FIG. 2A, for the embodiment, the spacers 202 are illustrated as being abutted against the side surfaces 204 of the bottom electrodes 104 and 106. However, in alternate embodiments, the spacers do not necessarily need to be abutted against the side surfaces 204 (see e.g. FIG. 2D). Further, for the embodiment, the portion of the spacers 204 nearest to the side surfaces 204 is illustrated as having about the same height as the height of the bottom electrodes (i.e., the distance between the top surface 206 and the support surface 108), resulting in the spacer 202 covering the entire side surface areas 210. Additionally, although the top portion of the spacers 202 are depicted as being rounded, in other embodiments, the top portion of the spacers 202 may be shaped in other manners as will be depicted in, for example, FIGS. 2B to 2D.

For the embodiment of FIG. 2A, the placement of the spacers 202 although does not move the original transition points (the original transition points are at the electrode corners 208), they create second transition points 209 further away from the bottom electrodes 104 and 106 to the point where the top surface of the spacers 202 suddenly drop down to the support surface. Further, the spacers 202 effectively reduce the sharpness of the transition between the first transition points 208 and the second transition points 209). Thinning of the ferroelectric layer may still occur but it will occur at the second transition points 209 away from the bottom electrodes 104 and 106. As a result, the thickness of the ferroelectric layer 110 may be maintained at least in the area around the actual electrode corners 208 of the bottom electrodes 104 and 106. Any holes that may develop will occur away from the bottom electrodes 104 and 106 and the dielectric properties of the spacers 202 (if the spacers 202 are made of insulation material) may prevent any electrical short from occurring between the top electrodes 112 and 114 and the bottom electrodes 104 and 106.

FIG. 2B depicts two memory cells with spacers according to another embodiment. For the embodiment, the spacers 202 have a sloping surface 210. Thus, although the transition point may remain at the electrode corners 208, the sharpness of the transition is reduced. In other words, the transition from the higher elevation of the top surfaces 206 of the bottom electrodes 104 and 106 to the support surface 108 are made more gradual with the sloping spacers 202. As a result, the thickness of the ferroelectric layer 110 may be better maintained even around the transition area.

FIG. 2C depicts two memory cells with spacers according to another embodiment. For the embodiment, the spacers 202 are rectangularly shaped and abutted against the side surfaces 202 of the bottom electrodes 104 and 106. The spacers 202 having about the same height as the height of the bottom electrodes (i.e., the distance between top surface of the bottom electrode and the support surface). However, unlike the spacers 202 depicted in FIGS. 2A and 2B, the rectangularly shaped spacers 202 do not reduce the sharpness of the transition. Instead, the transition points 210 are moved away from the bottom electrodes 104 and 106 and the electrode corners 208. As a result, a separation distance is created by the spacers 202 between the bottom electrode and the transition point 210 (where a thin ferroelectric layer may still form). Thus, although the ferroelectric layer 110 that is in vicinity of the transition points 210 may be thin (as indicated by 212), the thin ferroelectric layer 110 that exists there will not result in the formation of an electrical short between the top electrodes 112 and 114 and bottom electrodes 104 and 106. Further, if the spacers 202 comprise of insulation material then the spacers 202 themselves may inhibit the formation of electrical shorts due to its dielectric properties.

FIG. 2D depicts two memory cells with spacers according to another embodiment. Like the spacers of FIG. 2C, the spacers 202 here are rectangularly shaped. However, unlike the spacers of FIG. 2C, the spacers 202, although adjacent to the side surfaces 204 of the bottom electrodes 104 and 106, are not abutted against the side surfaces 204 of the bottom electrodes 104 and 106. Instead, the spacers 202 are separated from the bottom electrodes 104 and 106. Like the embodiment depicted in FIG. 2C, the spacers 202 here do not reduce the sharpness of the transition but instead moves the transition point 210 away from the bottom electrodes 104 and 106 and electrode corners 208. As a result, no electrical shorts may form between the top electrodes 112 and 114 and bottom electrodes 104 and 106 even though a thin ferroelectric layer may exist in the vicinity of the transition point 210. Again, if the spacer 202 comprises of insulation material, than the spacer 202 may further act as a barrier to prevent electrical shorts.

The addition of spacers, as illustrated in FIGS. 2A to 2D, may have, in addition to the benefit of reducing or eliminating the possibility of electrical shorts, the benefit of reducing or eliminating the possibility of parasitic cells forming in the gaps 122 between the bottom electrodes 104 and 106. That is, if the spacers 202 are formed with dielectric material, then the portion of the ferroelectric layer 110 that occupies at least part of the gaps 122 between the bottom electrodes 104 and 106 may be sheltered from electric fields generated by the top and bottom electrodes 112 and 114.

Those skilled in the art may recognize that many other spacer shapes are possible other than the four spacer structures that were depicted in FIGS. 2A to 2D. For example, the spacers 202 may have a stairway shape or the spacers 202 may have a height greater than the height of the electrodes. Therefore, the four structures presented in FIGS. 2A to 2D are not meant to be exhaustive but are presented for purposes of illustrating the various possible spacer structures.

Figure 3:
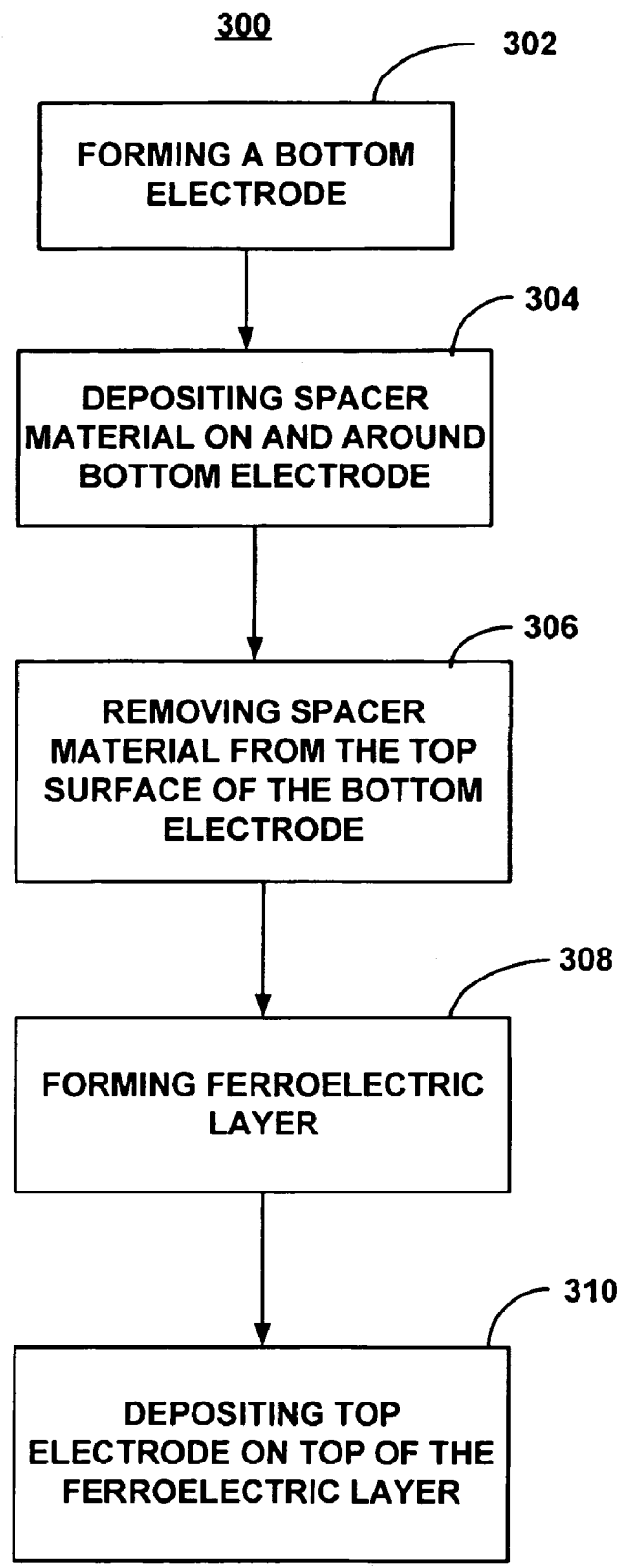
FIG. 3 illustrates is a flow chart for forming a memory cell with a spacer in accordance with some embodiments.

FIG. 3 illustrates a process 300 for forming memory cells with spacers according to some embodiments. The process 300 may begin when a bottom electrode 104 and 106 is formed by depositing electrode material on a support surface 108 and patterning the electrode material using, for example, lithography and etch processes or other suitable means at 302. The electrode material may be any type of conductive material that may be suitable for such purpose. These include materials such as but are not limited to nitrides or oxides such as titanium nitride or tantalum nitride, aluminum, aluminum alloy, copper, copper alloy, titanium, titanium alloy, and silicides (such as silicides comprising tungsten, titanium, nickel and cobalt). The support surface 108 may be a dielectric or insulation material such as but are not limited to silicon dioxide, either doped or undoped with phosphorus (PSG) or boron and phosphorus (BPSG), silicon nitride, silicon oxynitride, silicon carbide, a carbon doped oxide, or a polymer. The support surface 108 may be located on a substrate of a die or chip.

After patterning the bottom electrode 104 and 106, spacer material (i.e., dielectric or insulation material) with conformal or near conformal deposition properties may be deposited on and around the bottom electrode 104 and 106 to begin the spacer formation at 304. Conformal material is a material that may be nonconductive, such as but are not limited to plastic or inorganic material, and that conforms to the shape of the components that it is coated or formed on. The spacer material may be deposited using, for example, plasma enhanced chemical vapor deposition (PECVD), non-ferroelectric polymer spin deposition, or by other suitable means. The thickness of the spacer material deposited may determine the depth (i.e., the maximum distance that the spacer 202 will extend out from the side surface 204) of the spacer 202. According to some embodiments, the thickness of the deposited spacer material is about the thickness of the bottom electrode 104 and 106 (i.e., distance between the support surface 108 and the top surface 206 of the bottom electrode). The spacer material may be a dielectric or insulation material such as but are not limited to silicon dioxide, either doped or undoped with phosphorus (PSG) or boron and phosphorus (BPSG), silicon nitride, silicon oxynitride, silicon carbide, a carbon doped oxide, or a polymer.

After the deposition of the spacer material on and around the bottom electrode 104 and 106, the spacer material that is on the top electrode surface 206 of the bottom electrode 104 and 106 may be removed to expose the top electrode surface 206 while leaving spacer material on the sides of the bottom electrode to complete the spacer formation at 306. The spacer material removal process from the top electrode surface 206 may be a blanket dry or wet etch back process, or other removal processes suitable for such purposes such as chemical mechanical polishing (CMP). Following the formation of the spacer 202, a ferroelectric layer 110 may be formed by depositing ferroelectric material on top of the bottom electrode 104 and 106 and the spacer 202 at 308. The deposition of the ferroelectric material may be by, for example, spincoating and annealing the ferroelectric material to the bottom electrode 104 and 106. The ferroelectric material may be but are not limited to a polymer such as poly vinylidene fluoride (PVDF, whose repeat formula is ($CH_2$—$CF_2)_n$), and some of its copolymers.

Once the ferroelectric layer 110 has been formed, a top electrode material may be deposited and patterned on top of the ferroelectric layer 110 at 310. The deposition of the top electrode material may be by, for example, any of the suitable deposition techniques known in the art. The formation of the top electrode 112 and 114 is then completed using, for example, lithography and etch processes or other suitable methods. The top electrode 112 and 114 may comprise of the same material used to form the bottom electrode and/or other conductive material suitable for such purposes.

Figure 4:
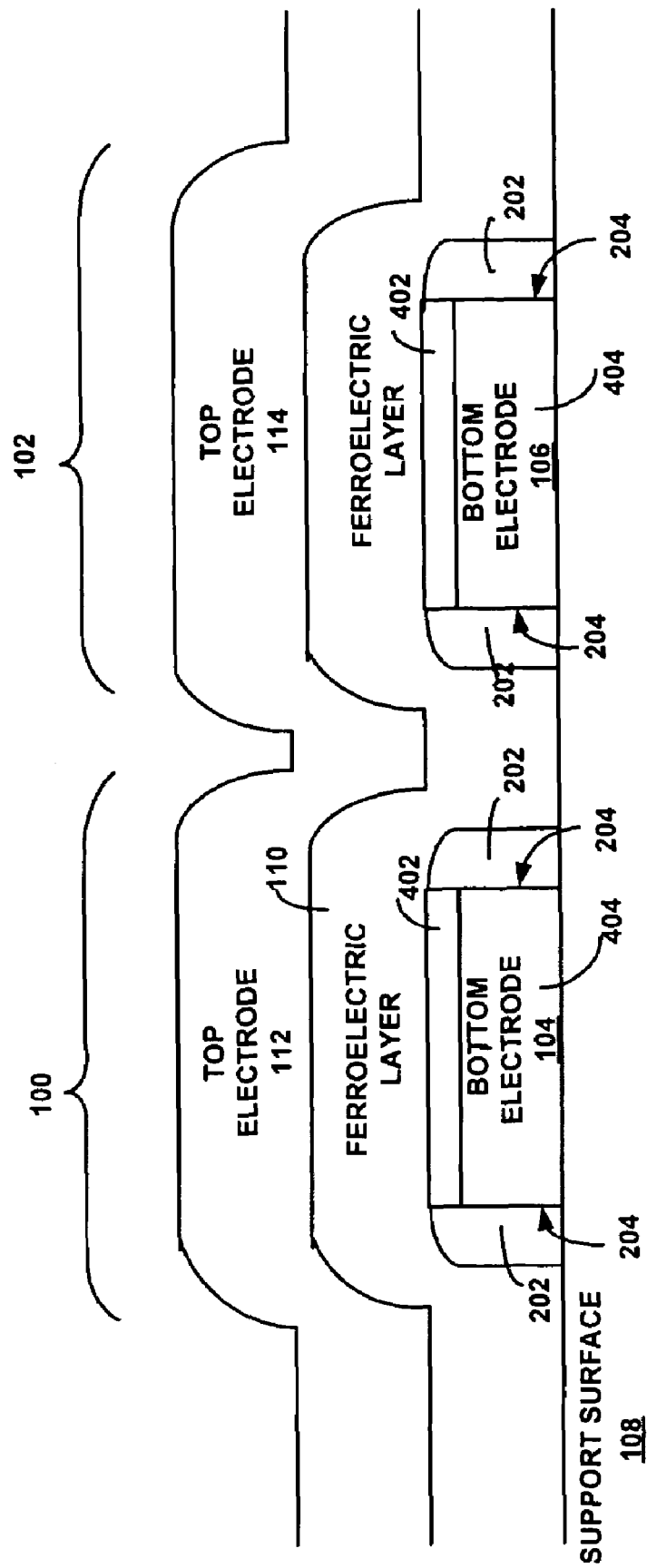
FIG. 4 illustrates two adjacent ferroelectric memory cells with spacers and bottom electrodes made of two portions in accordance with some embodiments of the invention.

FIG. 4 illustrates two memory cells 100 and 102 with spacers 202 and bottom electrodes having top and bottom portions 402 and 404 according to one embodiment of the invention. Again, each of the memory cells 100 and 102 includes top and bottom electrodes 114, 116, 104 and 106 with a ferroelectric layer 110 sandwiched between the top and bottom electrodes 114, 116, 104 and 106. Each of the memory cells 100 and 102 may have bottom electrodes 104 and 106 that comprises of a top portion 402 and a bottom portion 404, the top and bottom portions made from different materials. For the embodiment, the top portions 402 are located at the top surfaces of the bottom electrodes 104 and 106. Between the top portions 402 and the support surface 108 are the bottom portions 404. The bottom portions 404 may comprise of material that is highly conductive but may be reactive to the ferroelectric layer material. The top portion 402, on the other hand, may comprise of material that is less reactive to the ferroelectric layer material. The spacers 202 may be abutted against the side electrode surfaces 204 of the bottom electrodes 104 and 106 completely covering the exposed bottom portions 404 thus isolating the reactive bottom portions 404 from the ferroelectric layer material.

Figure 5:
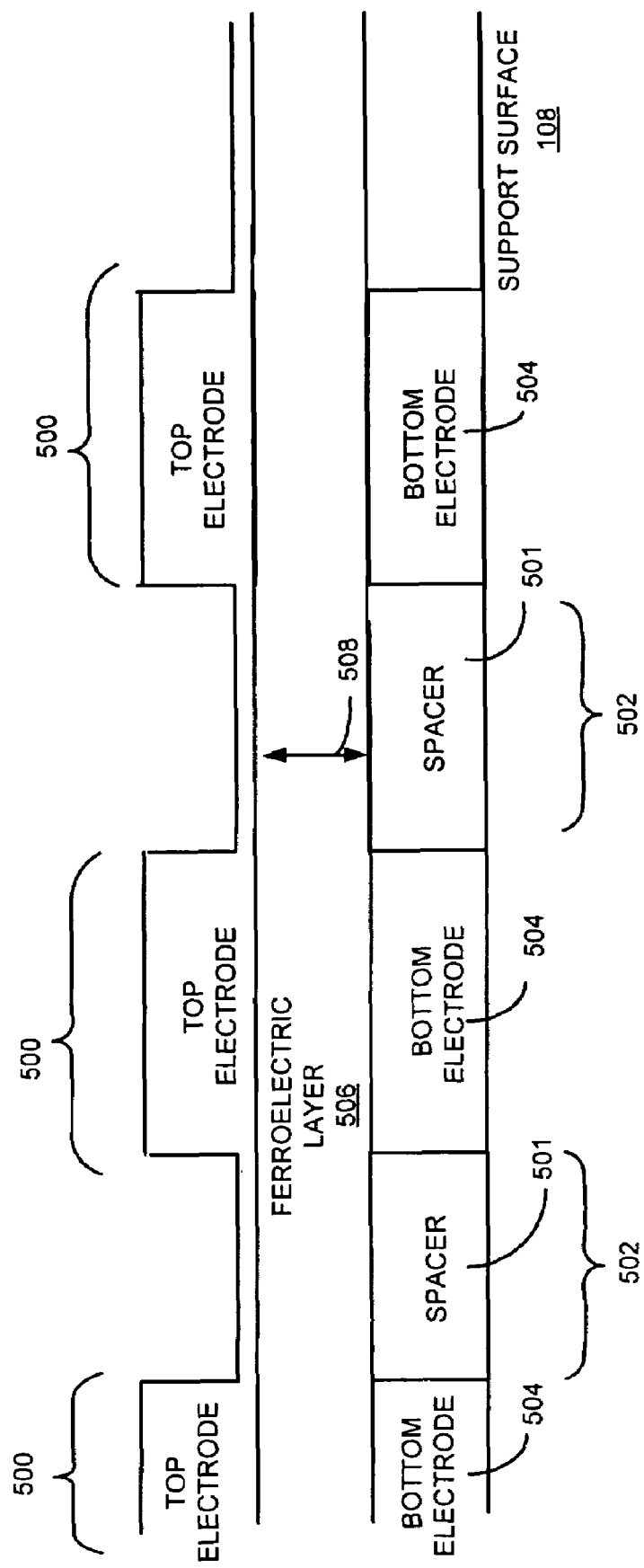
FIG. 5 illustrates two adjacent ferroelectric memory cells with spacers filling gaps between adjacent bottom electrodes in accordance with some embodiments of the invention.

FIG. 5 illustrates memory cells with spacers 501 that completely fill the gap between adjacent bottom electrodes according to one embodiment. For the embodiment, the gaps 502 between the bottom electrodes 504 are filled with spacer material. By completely filling the gaps 502, the transition point and the transition may be completely eliminated resulting in the ferroelectric layer 506 having a consistent thickness 508 regardless of location. In order to form such a structure, one possible approach is to use a damascene process for forming the bottom electrodes 504 and the side spacers 501.

Figure 6:
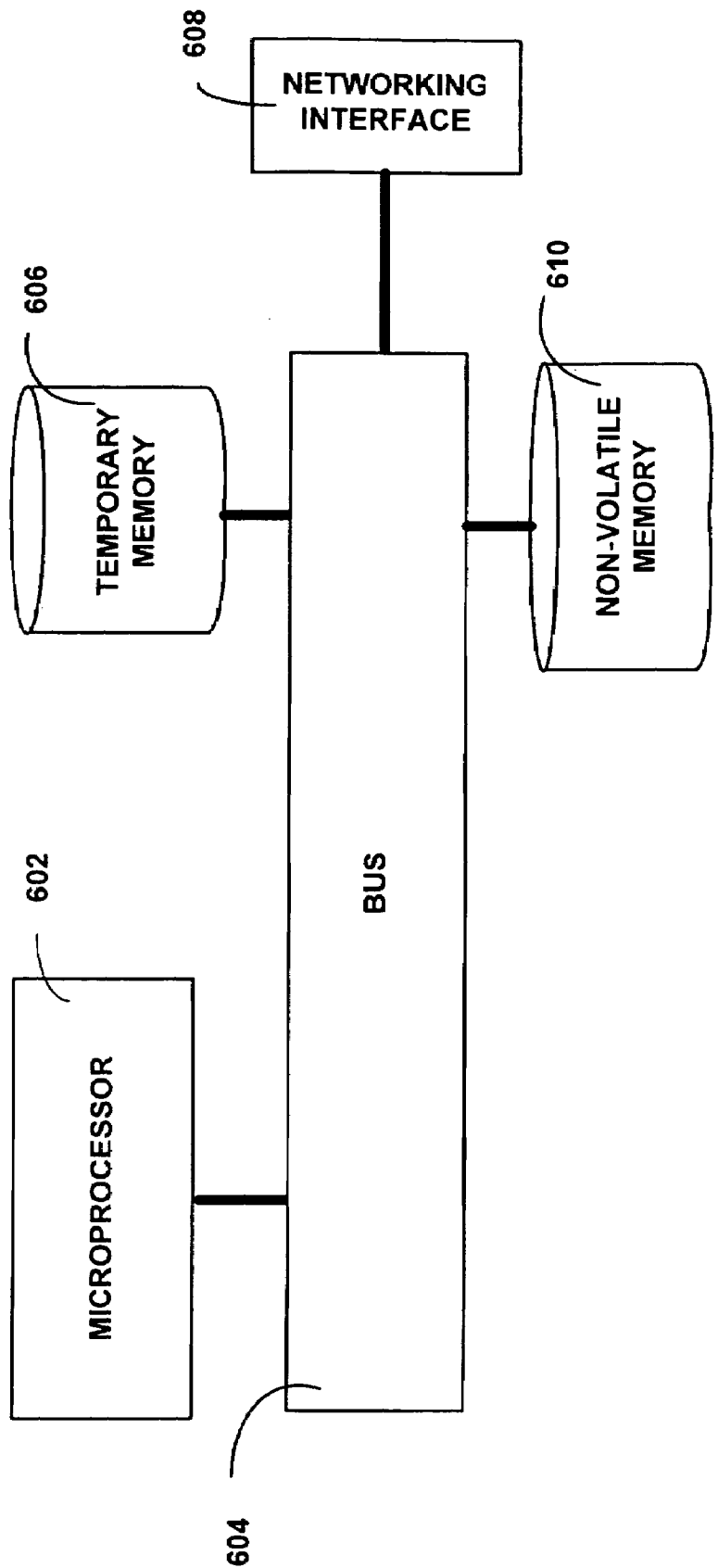
FIG. 6 illustrates a system that incorporates an array of memory cells with electrodes and spacers in accordance with some embodiments of the invention.

Referring now to FIG. 6, where a system 600 in accordance with some embodiments is shown. The system 600 includes a microprocessor 602 that may be coupled to a bus 604. The system 600 may further include temporary memory 606, a network interface 608, and a non-volatile memory 610. One or more of the above enumerated elements, such as microprocessor 502, temporary memory 506, non-volatile memory 610, and so forth, may contain one or more of the memory cells that advantageously incorporate the spacers described above. Depending on the applications, the system 600 may include other components, including but not limited to chipsets, RF transceivers, mass storage (such as hard disk, compact disk (CD), digital versatile disk (DVD), graphical or mathematic co-processors, and so forth.

One or more of the system components may be located on a single chip such as a SOC. In various embodiments, the system 600 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An integrated circuit, comprising:
    a first electrode formed on a support surface, the first electrode having a first electrode surface that intersects the support surface;
    a spacer positioned on the support surface adjacent to the first electrode surface, wherein the spacer is separated from the first electrode surface; and
    a ferroelectric layer formed on the first electrode and the spacer.

2. The integrated circuit of claim 1 further comprises a second electrode formed on the ferroelectric layer opposite of the first electrode.

3. The integrated circuit of claim 2, wherein the second electrode adaptedly formed on the ferroelectric layer opposite the first electrode to form a memory cell.

4. The integrated circuit of claim 1 wherein the spacer comprises of an insulation material.

5. The integrated circuit of claim 1 wherein the ferroelectric layer comprises of a polymer.

6. The integrated circuit of claim 1 wherein the support surface comprises of insulation material.

7. The integrated circuit of claim 1 wherein a portion of the spacer nearest to the first electrode surface has a height about equal to a height of the first electrode, the height of the first electrode being a distance between the support surface and a second electrode surface of the first electrode, the second electrode surface being substantially parallel to the support surface.

8. The integrated circuit of claim 1 wherein the support surface is located on a die.

9. The integrated circuit of claim 1 wherein the first electrode comprises first and second portions, the first portion comprising a first material that is non-reactive to the ferroelectric layer and located at a second electrode surface of the first electrode, the second electrode surface being parallel to the support surface, and the second portion comprising a second material that is more conductive than said first material and located between the first portion and the support surface.

10. The integrated circuit of claim 1 wherein the integrated circuit is a memory circuit.

11. The integrated circuit of claim 10 wherein the integrated circuit is a non-volatile memory circuit.

* * * * *